(12) United States Patent
Owaki et al.

(10) Patent No.: US 12,212,825 B2
(45) Date of Patent: Jan. 28, 2025

(54) SENSOR MODULE

(71) Applicant: Sony Semiconductor Solutions Corporation, Kanagawa (JP)

(72) Inventors: Hirofumi Owaki, Kanagawa (JP); Tomonori Agawa, Kanagawa (JP); Kunihiko Togano, Kanagawa (JP); Hiroo Suzuki, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 276 days.

(21) Appl. No.: 17/799,231

(22) PCT Filed: Feb. 10, 2021

(86) PCT No.: PCT/JP2021/005010
§ 371 (c)(1),
(2) Date: Aug. 11, 2022

(87) PCT Pub. No.: WO2021/166768
PCT Pub. Date: Aug. 26, 2021

(65) Prior Publication Data
US 2023/0071961 A1 Mar. 9, 2023

(30) Foreign Application Priority Data
Feb. 19, 2020 (JP) .................... 2020-026041

(51) Int. Cl.
*H04N 23/51* (2023.01)
*H04N 23/52* (2023.01)
(Continued)

(52) U.S. Cl.
CPC ............ *H04N 23/51* (2023.01); *H04N 23/52* (2023.01); *H04N 23/54* (2023.01); *H05K 1/144* (2013.01); *H05K 9/0049* (2013.01)

(58) Field of Classification Search
CPC ........ H04N 23/51; H04N 23/52; H04N 23/54; H04N 23/57; H05K 1/144; H05K 9/0049;
(Continued)

(56) References Cited

U.S. PATENT DOCUMENTS

| 10,747,015 B2* | 8/2020 | Park ................. G02B 13/001 |
| 2012/0181641 A1 | 7/2012 | Hiramoto |
| 2018/0287306 A1 | 10/2018 | Grimes |

FOREIGN PATENT DOCUMENTS

| CN | 109425757 A | 3/2019 |
| CN | 110071955 A | 7/2019 |

(Continued)

OTHER PUBLICATIONS

International Search Report and English translation thereof mailed Apr. 13, 2021 in connection with International Application No. PCT/JP2021/005010.
(Continued)

*Primary Examiner* — Briggitte R. Hammond
(74) *Attorney, Agent, or Firm* — Wolf, Greenfield & Sacks, P.C.

(57) ABSTRACT

A sensor module according to an embodiment of the present technology includes a housing, a sensor board, an external connector, a flexible printed circuit, and a metallic shield case. The flexible printed circuit electrically connects the sensor board and the external connector, the flexible printed circuit including a signal line and a ground line. The shield case includes a bottom portion that is arranged between the flexible printed circuit and the external connector. The external connector includes a first connection pin that is connected to the signal line, a second connection pin that is connected to the ground line, and a third connection pin that is connected to the bottom portion of the shield case. The bottom portion includes a first hole, a second hole, a third hole, and a thermal storage, the first hole being a hole (Continued)

through which the first connection pin passes, the second hole being a hole through which the second connection pin passes, the third hole being a hole through which the third connection pin passes, the thermal storage being provided around the third hole and covered with a solder material used to join the third connection pin to the bottom portion.

11 Claims, 4 Drawing Sheets

(51) Int. Cl.
    *H04N 23/54*     (2023.01)
    *H05K 1/14*     (2006.01)
    *H05K 9/00*     (2006.01)

(58) Field of Classification Search
    CPC ...... H05K 9/0007; H01R 4/025; H01R 12/62; H01R 43/0242; H01R 13/04
    See application file for complete search history.

(56) References Cited

FOREIGN PATENT DOCUMENTS

| | | |
|---|---|---|
| CN | 110770548 A | 2/2020 |
| JP | 3012356 U | 6/1995 |
| JP | 2004134491 A | 4/2004 |
| JP | 2007-258404 A | 10/2007 |
| JP | 2009192486 A | 8/2009 |
| JP | 2011-166012 A | 8/2011 |
| JP | 5413231 B2 | 2/2014 |

OTHER PUBLICATIONS

International Written Opinion and English translation thereof mailed Apr. 13, 2021 in connection with International Application No. PCT/JP2021/005010.

International Preliminary Report on Patentability and English translation thereof mailed Sep. 1, 2022 in connection with International Application No. PCT/JP2021/005010.

Extended European Search Report issued Jul. 7, 2023 in connection with European Application No. 21757095.1.

Anonymous: "Thermal Relief", Aug. 11, 2019 (Aug. 11, 2019), pp. 1-2, XP093058144, Retrieved from Wikipedia [retrieved on Jun. 27, 2023], URL:https://en.wikipedia.org/w/index.php?title=Thermal_reliefSoldid=910300043.

J.S. Robinson et al., "The magnitude of heat treatment induced residual stresses and the thermal stress relief of aluminium alloys", Materials Science Forum, Jan. 1, 2002, pp. 355-360, 4047-40.

Zeng Li et al., "The Development and Heat Dispersion Problem in Integrate Circuit Packaging", Electronics and Packaging, Sep. 20, 2006, 12 pages, vol. 6, No. 9.

\* cited by examiner

SENSOR MODULE

CROSS REFERENCE TO RELATED APPLICATIONS

This is a U.S. National Stage Application under 35 U.S.C. §371, based on International Application No. PCT/JP2021/005010, filed Feb. 10, 2021, which claims priority to Japanese Patent Application JP 2020-026041, filed Feb. 19, 2020, each of which is hereby incorporated by reference in its entirety.

TECHNICAL FIELD

The present technology relates to a sensor module mounted on, for example, a vehicle.

BACKGROUND ART

A camera apparatus that is mounted on a vehicle and used to perform visual recognition using a monitor apparatus placed near a cockpit has been provided in the past, in order to improve the convenience and the safety for the vehicle. This type of camera apparatus includes a substantially rectangular housing into which, for example, an imaging lens, an imaging device, and an external connector are incorporated, and the housing is built in or attached to, for example, a rear door, a sideview mirror, or a front spoiler of a vehicle body such that the imaging lens faces the outside. Such a camera apparatus makes it possible to capture an image of surroundings of a vehicle that are a blind spot as viewed from a driver, and thus to improve the safety and the convenience.

In this type of camera apparatus, there is a need to determine a position of an imaging device in a housing and to stably electrically connect an external connector and a board on which the imaging device is mounted, in order to acquire a high-quality image signal from the imaging device. For example, Patent Literature 1 discloses a camera apparatus that includes, in a housing, a shield case used to take electromagnetic-compatibility (EMC) measures, the shield case being connected to a ground pattern of a flexible printed circuit that connects an external connector and a board on which the imaging device is mounted.

CITATION LIST

Patent Literature

Patent Literature 1: Japanese Patent No. 5413231

DISCLOSURE OF INVENTION

Technical Problem

Recently, there is a need to further improve EMC measures adopted in a sensor module. With respect to the EMC measures, there is a need to stably connect a shield case to a ground line of an external connector. However, heat escapes to the shield case when the shield case is joined to a ground line using soldering, since the shield case is made of a metallic material. This may result in difficulty in successfully facilitating an operation and ensuring the reliability in stable connection.

In view of the circumstances described above, it is an object of the present technology to provide a sensor module that makes it possible to facilitate an operation of soldering a shield case to a ground line, and to increase the reliability in connecting the shield case and the ground line.

Solution to Problem

A sensor module according to an embodiment of the present technology includes a housing, a sensor board, an external connector, a flexible printed circuit, and a metallic shield case.

The sensor board includes a sensor element and is arranged in the housing.

The external connector is provided to the housing.

The flexible printed circuit electrically connects the sensor board and the external connector, the flexible printed circuit including a signal line and a ground line.

The shield case includes a bottom portion and a peripheral surface portion, the bottom portion being arranged between the flexible printed circuit and the external connector, the peripheral surface portion covering around the sensor board.

The external connector includes a first connection pin that is connected to the signal line, a second connection pin that is connected to the ground line, and a third connection pin that is connected to the bottom portion of the shield case.

The bottom portion includes a first hole, a second hole, a third hole, and a thermal storage, the first hole being a hole through which the first connection pin passes, the second hole being a hole through which the second connection pin passes, the third hole being a hole through which the third connection pin passes, the thermal storage being provided around the third hole and covered with a solder material used to join the third connection pin to the bottom portion.

In the sensor module, the shield case and a ground of the external connector are easily soldered since the thermal storage is provided to the bottom portion of the shield case. This makes it possible to facilitate an operation and to increase the reliability in connection.

The flexible printed circuit may further include a base-material end that supports the signal line and the ground line and is arranged in the bottom portion. In this case, the base-material end includes an opening through which the third connection pin passes, the opening having a larger opening area than the third hole, and the thermal storage is provided to a region that faces the opening.

The thermal storage may include a plurality of slits annularly formed around the third hole.

The thermal storage may include a concave portion that is annularly formed around the third hole.

The thermal storage may include a heat transfer portion that is more highly thermally conductive than a metallic material of the bottom portion.

The third connection pin may be arranged offset from a center of the opening.

The opening may be formed into a circular shape or an elliptic shape.

The opening may include a plurality of openings respectively provided correspondingly to connection pins of the plurality of connection pins.

The sensor element may be a solid-state imaging device.

The sensor module may be attachable to a vehicle.

MODE(S) FOR CARRYING OUT THE INVENTION

Embodiments according to the present technology will now be described below with reference to the drawings.

Overall Configuration of Sensor Module

Figure 1:
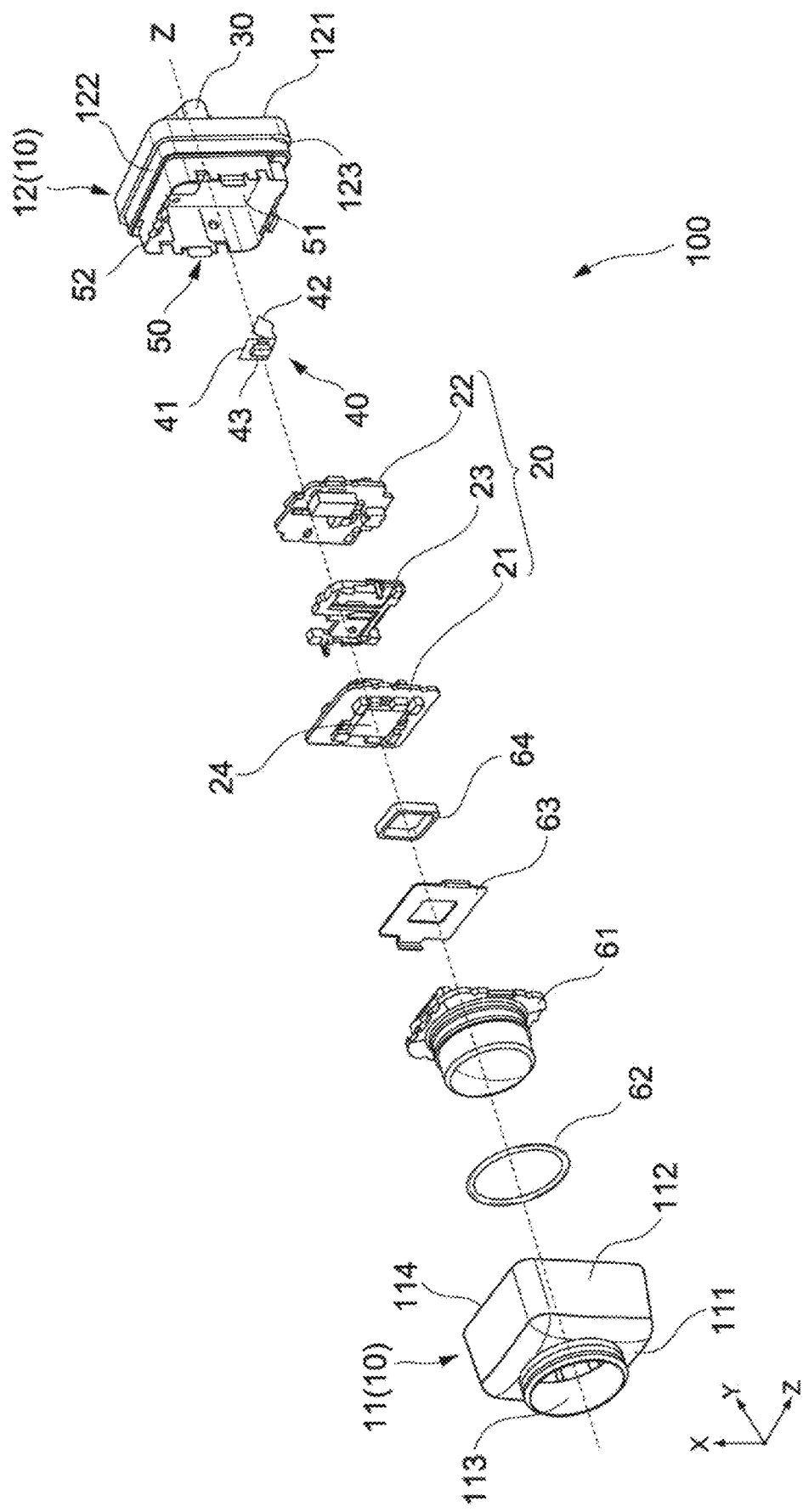
FIG. 1 is an exploded perspective view illustrating a configuration of a sensor module according to an embodiment of the present technology.

FIG. 1 is an exploded perspective view illustrating a configuration of a sensor module according to an embodiment of the present technology. A sensor module 100 of the present embodiment is configured as a camera module used by being mounted on a vehicle. First, an overall configuration of the sensor module 100 is described with reference to FIG. 1.

The sensor module 100 can be attached to a vehicle. For example, the sensor module 100 is arranged outside of a vehicle body (an attachment target) (not illustrated), and captures an image of a region situated ahead of a vehicle, an image of a region situated behind the vehicle, or a region on a lateral side of the vehicle depending on an attachment position.

For example, the sensor module 100 attached to a front portion (for example, a radiator grill) of a vehicle body captures an image of an environment ahead of the vehicle. Further, the sensor module 100 attached to a rear portion (for example, above a license plate) of the vehicle body captures an image of an environment behind the vehicle. Furthermore, the sensor module 100 attached to a side portion of the vehicle (for example, an upper portion of a pillar (an A-pillar, a B-pillar, or a pillar (a C-pillar, a D-pillar) situated in a rearmost portion of the vehicle, or a sideview mirror) captures an image of an environment in a lateral direction of the vehicle.

As illustrated in FIG. 1, the sensor module 100 of the present embodiment includes a housing 10, a sensor board 20, an external connector 30, a flexible printed circuit 40, and a shield case 50.

(Housing)

The housing 10 is configured by a front case 11 and a rear case 12 being combined in a direction of an optical axis Z. Typically, the front case 11 and the rear case 12 are injection-molded bodies made of a synthetic resin material.

The front case 11 includes a front surface portion 111 that is formed substantially orthogonal to a front-rear direction (the direction of Z), and a lateral surface portion 112 that extends toward the rear case 12 from a peripheral edge of the front surface portion 111. In the present embodiment, the front surface portion 111 is substantially rectangular as viewed from the direction of the optical axis Z. The front case 11 is hollow, and a space portion that accommodates therein, for example, the sensor board 20 is formed in a region surrounded by the front surface portion 111 and the lateral surface portion 112.

A through-hole 113 is formed in a middle portion of the front surface portion 111 of the front case 11, and a barrel member 61 is inserted into the through-hole 113 through a seal ring 62. The barrel member 61 supports an imaging lens that has the optical axis Z, and is supported between the front case 11 and the sensor board 20 through, for example, a shield plate 63 and a cushion member 64.

At an end of the lateral surface portion 112 that is situated on the side of the rear case 12, the front case 11 includes an opening end 114 that is welded to the rear case 12. The opening end 114 is formed to be substantially rectangular correspondingly to an outer shape of the front surface portion 111. Note that the front surface portion 111 and the opening end 114 are not limited to being rectangular, and may be formed into another shape, such as a circular shape or a triangular shape.

The rear case 12 is formed into a generally rectangular plate shape that includes a bottom surface portion 121 that is formed substantially orthogonal to the front-rear direction, and a lateral surface portion 122 that extends toward the front case 11 from a peripheral edge of the bottom surface portion 121. A space portion that accommodates therein, for example, the shield case 50 is formed in a region surrounded by the bottom surface portion 121 and the lateral surface portion 122. A substantially rectangular step portion 123 is formed between the bottom surface portion 121 and an outer peripheral surface of the lateral surface portion 122. The front case 11 and the rear case 12 are integrated with each other by the opening end 114 of the front case 11 being welded to the step portion 123. A welding method is not particularly limited, and, for example, ultrasonic welding or laser welding method can be applied.

(Sensor Board)

The sensor board 20 includes a front board 21 that faces the front surface portion 111 of the front case 11, a rear board 22 that faces the bottom surface portion 121 of the rear case 12, and a spacer 23 that is arranged between the front board 21 and the rear board 22. The front board 21 and the rear board 22 are rigid double-sided circuit boards such as glass epoxy boards, and a facing distance between the boards is defined by the spacer 23. The front board 21 and the rear board 22 are mechanically and electrically connected to each other through a board connector (a B-to-B connector) (not illustrated). The sensor board 20 is not limited to being formed of two boards that are the front board 21 and the rear board 22, and may be formed of a single board.

A solid-state imaging device 24 is mounted on the front board 21 as a sensor element. The solid-state imaging device 24 is an image sensor such as a complementary metal-oxide semiconductor (CMOS) image sensor or a charge coupled device (CCD) image sensor. The front board 21 is joined to the barrel member 61, and the solid-state imaging device 24 is arranged at a focal point of the barrel member 61. Further, through the flexible printed circuit 40, the rear board 22 is electrically connected to the external connector 30 provided to the bottom surface portion 121 of the rear case 12.

(External Connector)

The external connector 30 is provided to the rear case 12. The external connector 30 is used to electrically connect the sensor board 20 and a vehicle body. Through the external connector 30, power is supplied from the vehicle body to the sensor board 20, and an image signal (an output signal of the solid-state imaging device 24) is transmitted from the sensor board 20 to the vehicle body.

Figure 2:
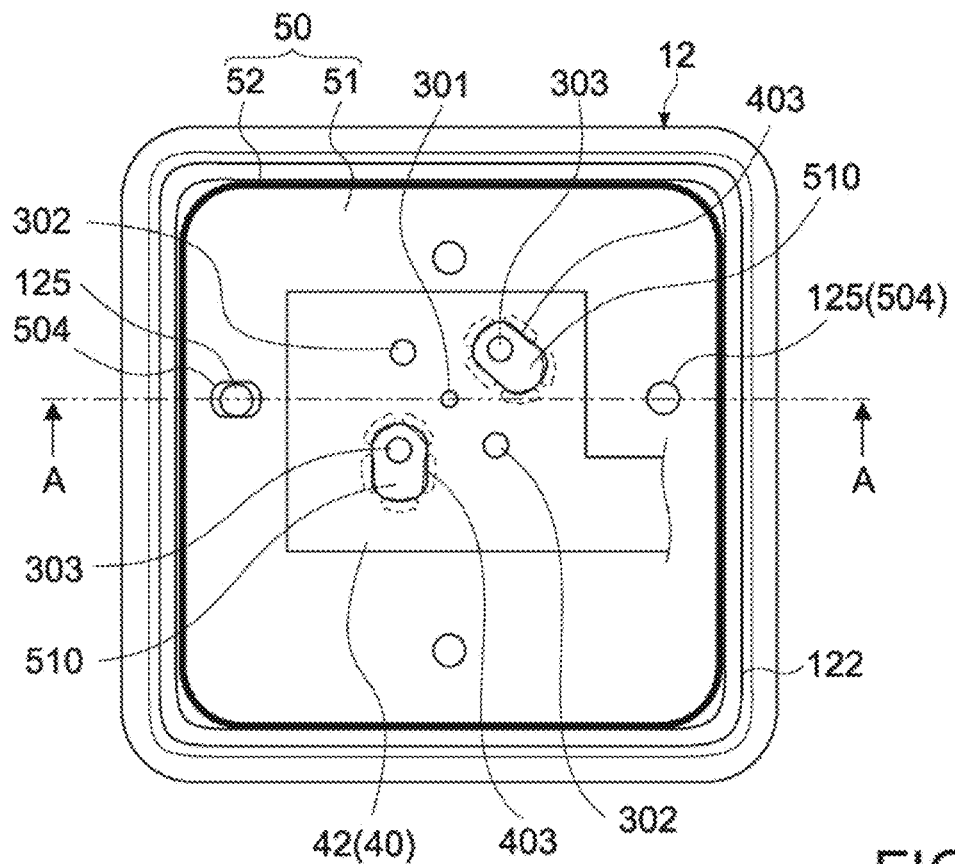
FIG. 2 is a schematic plan view of a primary portion in a housing included in the sensor module.
Figure 3:
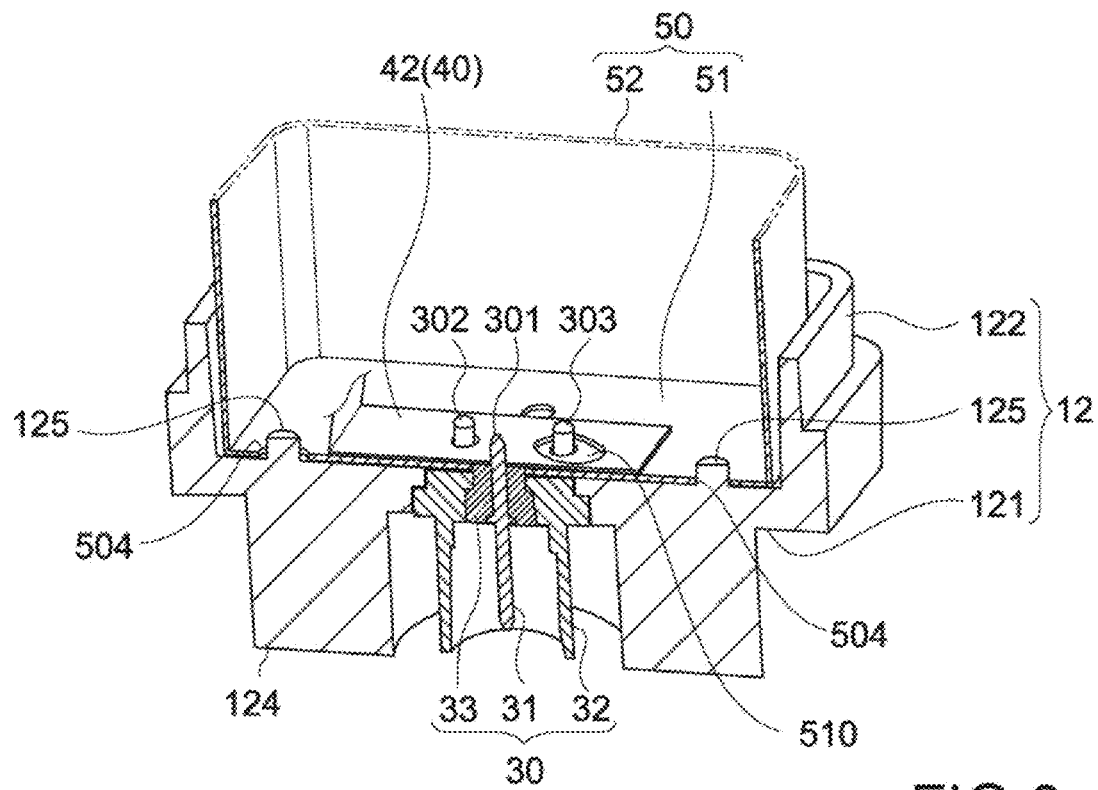
FIG. 3 is a cross-sectional view along the line A-A of FIG. 2.

FIG. 2 is a schematic plan view illustrating an internal structure of a primary portion on the side of the rear case 12, and FIG. 3 is a cross-sectional view along the line A-A of FIG. 2.

As illustrated in FIG. 3, the external connector 30 includes a signal terminal 31 that is provided to the bottom surface portion 121 of the rear case 12, a cylindrical shield terminal 32 that is formed concentrically with the signal terminal 31, and an insulating member 33 that is arranged between the signal terminal 31 and the shield terminal 32. Each of the signal terminal 31 and the shield terminal 32 is made of a metallic material, and can be connected to a coaxial cable (not illustrated).

A cylindrical portion 124 that is concentric with the external connector 30 is provided to the bottom surface portion 121 of the rear case 12. The cylindrical portion 124 is used to protect the signal terminal 31 and the shield terminal 32 from the outside, and is formed outside of the external connector 30 to be concentric with the external connector 30.

The external connector 30 further includes a first connection pin 301, a second connection pin 302, and a third connection pin 303. The first connection pin 301 passes through the bottom surface portion 121 of the rear case 12, and is integrally formed at an end of the signal terminal 31. The second connection pin 302 and the third connection pin 303 pass through the bottom surface portion 121 of the rear case 12, and are integrally formed at an end of the shield terminal 32.

A plurality of second connection pins 302 and a plurality of third connection pins 303 are formed, and, for example, two second connection pins 302 and two third connection pins 303 are formed, as illustrated in FIG. 2. In the present embodiment, the second connection pin 302 and the third connection pin 303 are respectively arranged at apexes of a virtual rectangle centered on the first connection pin 301. Here, the respective second connection pins 302 are arranged symmetrically with respect to the first connection pin 301 (arranged diagonal to each other). Likewise, the respective third connection pins 303 are arranged symmetrically with respect to the first connection pin 301 (arranged diagonal to each other).

(Flexible Printed Circuit)

The flexible printed circuit 40 electrically connects the sensor board 20 and the external connector 30. The flexible printed circuit 40 is a circuit board obtained by routing a signal line and a ground line on a flexible base material such as polyimide. The signal line is wiring that carries an image signal coming from the sensor board 20, and the ground line is wiring that is connected to a ground line of the sensor board 20. When the sensor board 20 and the external connector 30 are connected to each other using the flexible printed circuit 40, this makes it possible to absorb variations (tolerances) in a distance between the sensor board 20 and the external connector 30, and thus to ensure the reliability in a stable electrical connection between them.

The flexible printed circuit 40 includes a first base-material end 41 that is connected to the sensor board 20 (the rear board 22), and a second base-material end 42 that is connected to the external connector 30. The first base-material end 41 is connected to the rear board 22 through, for example, the connector member 43. The second base-material end 42 is connected to the external connector 30 using soldering.

Figure 4:
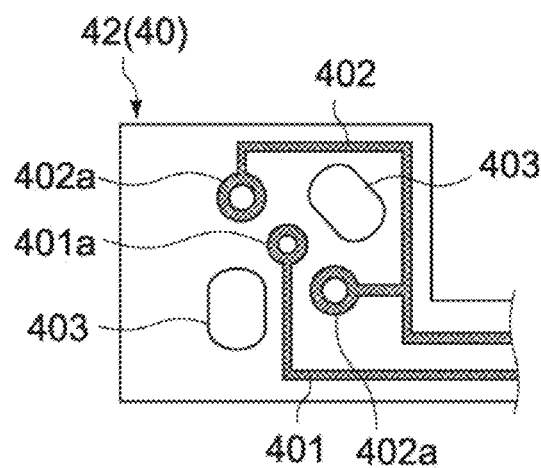
FIG. 4 is a schematic plan view of a primary portion of a flexible printed circuit included in the sensor module.

FIG. 4 is a schematic plan view of the second base-material end 42 of the flexible printed circuit 40. The second base-material end 42 supports the signal line 401 and the ground line 402. The signal line 401 and the ground line 402 each include a land that is electrically connected to the external connector 30.

For example, the signal line 401 includes a first land 401a that includes a through-hole and an annular conductor that is formed around the through-hole, where the first connection pin 301 passes through the through-hole. The first connection pin 301 is soldered to the first land 401a to be electrically connected to the signal line 401.

Further, the ground line 402 includes a second land 402a that includes a through-hole and an annular conductor that is formed around the through-hole, where the second connection pin 302 passes through the through-hole. The land 402a is provided correspondingly to the number of second connection pins 302 and a position of the second connection pin 302, and, in the present embodiment, the land 402a is provided at two positions. The second connection pin 302 is soldered to the second land 402a to be electrically connected to the ground line 402.

The second base-material end 42 of the flexible printed circuit 40 further includes an opening 403 through which the third connection pin 303 of the external connector 30 passes. The opening 403 is provided correspondingly to the number of third connection pins 303 and a position of the third connection pin 303, and, in the present embodiment, the third connection pin 303 is provided at two positions. The opening 403 has a larger opening area than the through-holes respectively included in the first and second lands 401a and 402a.

As will be described later, the opening 403 is a region in which a reservoir of a solder material used to join the third connection pin 303 to the shield case 50 is formed. A shape of the opening 403 is not particularly limited, but it is favorable that, in view of, for example, the wettability of a solder material, the opening 403 have a shape including no corners, such as an oval shape or an elliptic shape as illustrated in the figure, or a circular shape.

(Shield Case)

The shield case 50 is one of components used for EMC measures taken to protect the sensor board 20 from electromagnetic noise, and is a substantially rectangular box body of which an end situated on the side of the front case 11 is opened. The shield case 50 is typically made of a metallic material such as stainless steel or an aluminum alloy.

The shield case 50 is arranged in the space portion formed by the bottom surface portion 121 and the lateral surface portion 122 of the rear case 12. The shield case 50 includes a bottom portion 51 that is arranged on the bottom surface portion 121 of the rear case 12, and a peripheral surface portion 52 that covers around the sensor board 20. The peripheral surface portion 52 extends toward the front case 11 from a peripheral edge of the bottom portion 51 to form the space portion accommodating therein the sensor board 20. An end of the peripheral surface portion 52 is brought into elastic contact with a peripheral edge of the barrel member 61.

As illustrated in FIG. 3, the bottom portion 51 of the shield case 50 is arranged between the second base-material end 42 of the flexible printed circuit 40 and the external connector 30. The bottom portion 51 is a substantially rectangular flat plate parallel to the bottom surface portion 121 of the rear case 12.

Figure 5:
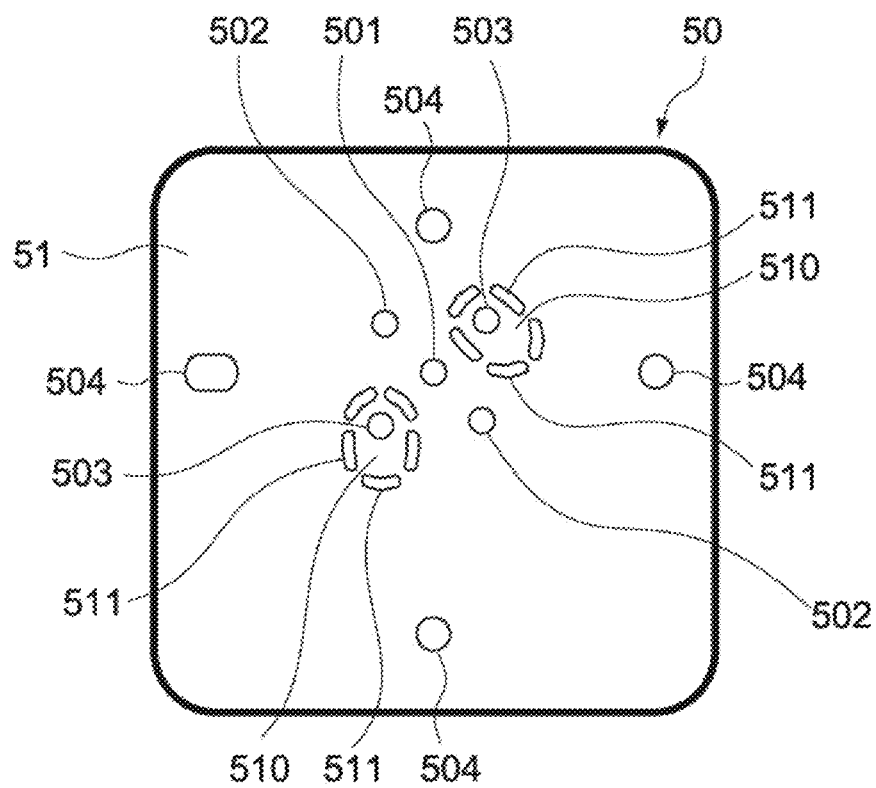
FIG. 5 is a plan view of a shield case included in the sensor module.

FIG. 5 is a plan view illustrating the bottom portion 51 of the shield case 50. The bottom portion 51 of the shield case 50 includes a plurality of holes through which the respective connection pins of the external connector 30 pass. In other words, the bottom portion 51 includes a first hole 501 through which the first connection pin 301 passes, a second hole 502 through which the second connection pin 302 passes, and a third hole 503 through which the third connection pin 303 passes. The second hole 502 and the third hole 503 are respectively provided correspondingly to the number of second connection pins 302 and a position of the second connection pin 302 and correspondingly to the number of third connection pins 303 and a position of the third connection pin 303. In the present embodiment, the second hole 502 and the third hole 503 are each provided at two positions.

The bottom portion 51 of the shield case 50 is soldered to the third connection pin 303 of the external connector 30 to be electrically connected to the shield terminal 32 of the external connector 30. For example, solder plating may be performed on the surface of the bottom portion 51, in order to increase the wettability of a solder material.

The bottom portion 51 of the shield case 50 includes a thermal storage 510 that is provided around the third hole 503. The thermal storage 510 is a region that is covered with a solder material used to join the third connection pin 303 to the bottom portion 51. The thermal storage 510 is provided to a region that faces the opening 403 formed in the second base-material end portion 42 of the flexible printed circuit 40. The opening 403 has a larger opening area than the third hole 503, and the thermal storage 510 is provided to a region of the bottom portion 51 that is exposed to the outside at least through the opening 403.

The thermal storage 510 includes a function of storing, in the opening 403, heat necessary for soldering when the third connection pin 303 and the shield case 50 are joined to each other. This results in increasing the solderability of the third connection pin 303. This makes it possible to facilitate an operation of soldering the shield case 50 and the external connector 30, and to increase the reliability in connecting the shield case 50 and the external connector 30.

In order to obtain such a function of the thermal storage 510, the thermal storage 510 according to the present embodiment includes a plurality of slits 511 annularly formed around the third hole 503. The plurality of slits 511 is annularly arranged to surround the region of the shield case 50 that is exposed from the opening 403 of the flexible printed circuit 40. The diffusion of heat from the thermal storage 510 to the outside is suppressed by partitioning off the thermal storage 510 using the plurality of slits 511, as described above.

A shape of each slit 511 is not particularly limited, and a linear slit and a curved slit may be included, as illustrated in FIG. 5. The plurality of slits 511 is typically formed along an opening edge of the opening 403 to have a shape that corresponds to an opening shape of the opening 403. The plurality of slits 511 may be provided further inward than the opening edge of the opening 403, but the area of the thermal storage 510 can be made larger by providing the plurality of slits 511 further outward than the opening edge. A width of each slit 511 and arrangement spacing between the slits 511 are not particularly limited, and can be set discretionarily according to, for example, an amount of heat stored in the thermal storage 510 and strength of the bottom portion 51 of the shield case 50.

A position of the third hole 503 in the opening 403 is also not particularly limited, and the third hole 503 may be situated at the center of the opening 403, or may be situated offset from the center of the opening 403. In the present embodiment, the third hole 503 is provided offset from the center of the opening 403, as illustrated in FIG. 5. Accordingly, a region used for a solder reservoir is easily ensured when the third connection pin 303 is soldered, and this makes it possible to further facilitate a soldering operation and to further increase the reliability in connection.

The bottom portion 51 of the shield case 50 further includes a positioning hole 504 used to position the bottom portion 51 relative to the bottom surface portion 121 of the rear case 12. The positioning hole 504 is provided at a plurality of positions, and a protrusion 125 that is provided to the bottom surface portion 121 of the rear case 12 is fitted into the positioning hole 504. A shape of the positioning hole 504 is not particularly limited. The positioning hole 504 is typically circular, but at least some of the positioning holes 504 may be oval or elliptic. This makes it possible to absorb an error in assembly that is caused due to, for example, a tolerance, and thus to facilitate assembly. Further, the protrusion 125 does not necessarily have to be provided at positions that correspond to all of the positioning holes 504, and may be provided at positions that correspond to at least two positioning holes 504.

[Method for Producing Sensor Module]

Next, a method for producing the sensor module 100 having the configuration described above is described.

The method for producing the sensor module 100 according to the present embodiment includes accommodating the sensor board 20 in the front case 11, accommodating the shield case 50 in the rear case 12, connecting the sensor board 20 and the external connector 30 using the flexible printed circuit 40, electrically connecting the shield case 50 and the shield terminal 32 of the external connector 30, and welding the front case 11 and the rear case 12 to each other to form the housing 10. Connecting the flexible printed circuit 40 and the shield case 50 to the external connector 30 is described below.

As illustrated in FIG. 2, the second base-material end 42 of the flexible printed circuit 40 is arranged on the bottom portion 51 of the shield case 50 accommodated in the rear case 12. The second base-material end 42 may be temporarily fixed to the bottom portion 51 of the shield case 50 using, for example, a double-sided tape.

As illustrated in FIG. 3, the first connection pin 301 of the external connector 30 passes through the first hole 501 of the shield case 50 and the first land 401a of the flexible printed circuit 40. The second connection pin 302 of the external connector 30 passes through the second hole 502 of the shield case 50 and the second land 402a of the flexible printed circuit 40. Further, the third connection pin 303 of the external connector 30 passes through the third hole 503 of the shield case 50 and the opening 403 of the flexible printed circuit 40.

Next, the first connection pin 301 and the first land 401a are joined to each other using soldering, the second connection pin 302 and the second land 402a are joined to each other using soldering, and the third connection pin 303 and the bottom portion 51 of the shield case 50 are joined to each other using soldering. In the present embodiment, laser soldering is adopted as the soldering. Without being limited thereto, soldering using a soldering iron may be adopted.

In the laser soldering, the first to third connection pins 301 to 303 are irradiated with laser light of a specified wavelength to be heated. Then, a wire rod of a solder material is brought into contact with each of the first to third connection pins 301 to 303 to be melted, and a fillet that covers around each of the first to third connection pins 301 to 303 is formed with the melted solder material. The first to third connection pins 301 to 303 are individually soldered, but may be simultaneously soldered.

For example, infrared laser light of a wavelength of from 800 nm to 1000 nm can be used as the laser light of the specified wavelength. The laser light may be continuous light or pulsed light. The solder material may include flux.

Upon melting of solder, the flux serves to remove, for example, an oxide that is formed on the surface of a joint target. This makes it possible to ensure an excellent solderability.

The present embodiment prevents heat generated by laser light being irradiated onto the third connection pin 303 from being widely diffused over the bottom portion 51 of the shield case 50 when the third connection pin 303 is soldered to the shield case 50, since the thermal storage 510 including a plurality of slits 511 is provided around the third hole 503 through which the third connection pin 303 passes. This results in facilitating an operation of soldering the third connection pin 303. Further, a melted solder material wets to spread over the entirety of the opening 403 since the opening being included in the flexible printed circuit 40 and through which the thermal storage 510 is exposed to the outside is formed into an elliptic shape or an oval shape. This makes it possible to stably form a solder joining portion with a desired joining strength.

Further, the present embodiment enables the shield case 50 to be stably connected to a ground potential since a plurality of third connection pins 303 electrically connecting the shield terminal 32 of the external connector 30 to the shield case 50 is provided. This makes it possible to obtain a desired shielding effect.

Furthermore, a heat distribution in the shield case 50 can be made uniform when the third connection pin 303 is soldered since the third connection pins 303 are provided symmetrically with respect to the first connection pin 301. This makes it possible to reduce a thermal load that acts on the first connection pin 301 (the signal line).

Other Embodiments

Figure 6:
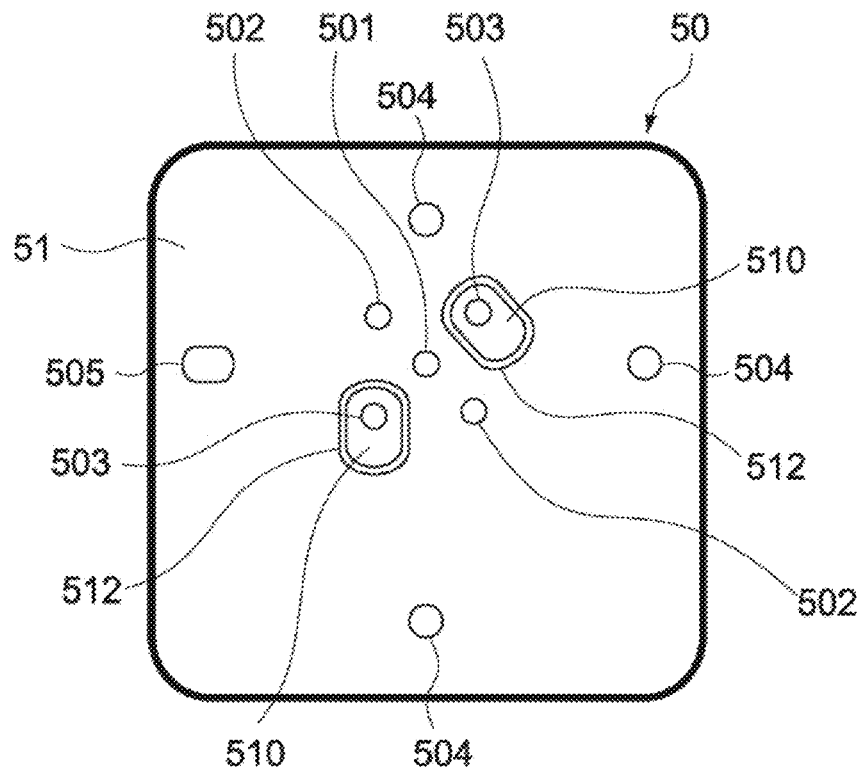
FIG. 6 is a schematic plan view illustrating another embodiment of the shield case.

In the embodiments described above, the thermal storage 510 including a specified heat storing function is formed by providing a plurality of slits 511 around the third hole 503 of the shield case 50, but the thermal storage 510 is not limited thereto. The thermal storage 510 may be formed of a concave portion 512 that is annularly formed around the third hole 503, for example, as illustrated in FIG. 6. Since a thin portion is locally formed in the bottom portion of the shield case 50 by the concave portion 512, it is possible to prevent heat from being diffused from an inner periphery to an outer periphery of the concave portion 512.

Figure 7:
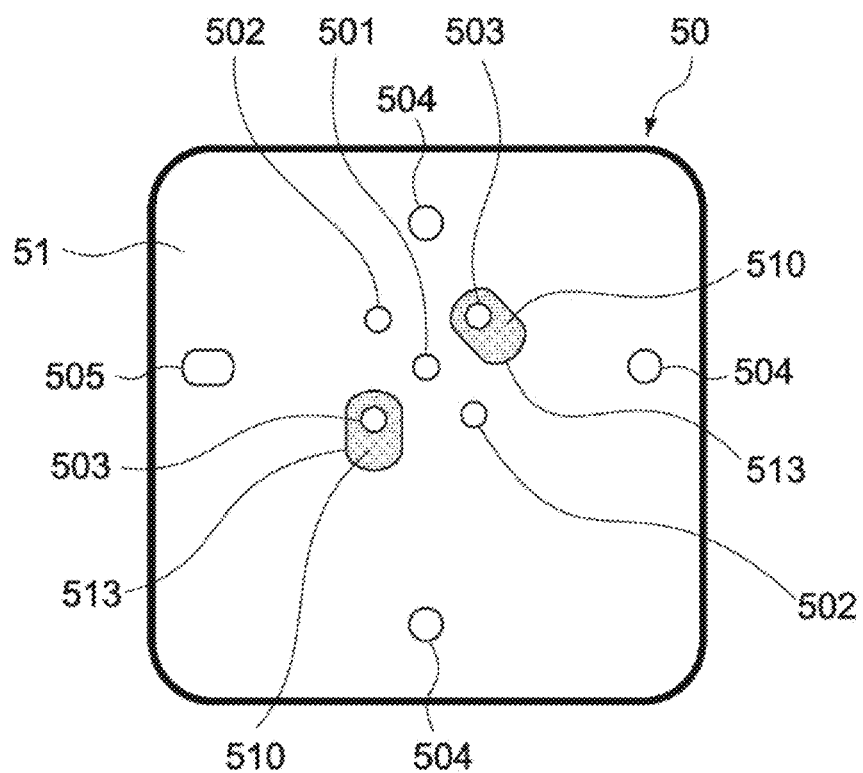
FIG. 7 is a schematic plan view illustrating yet another embodiment of the shield case.

Further, the thermal storage 510 may be formed by a heat transfer layer 513 that is locally provided around the third hole 503, as illustrated in FIG. 7. The heat transfer portion 513 is made of a material that is more highly thermally conductive than a metallic material of the bottom portion 51 of the shield case 50. This makes it possible to obtain effects similar to the effects described above. The heat transfer layer 513 is not particularly limited, and may be, for example, a metallic sheet or a metal plating layer.

<Modifications>

The technology according to the present disclosure can be applied to various products. For example, the technology according to the present disclosure may be provided as a sensor module that is mounted on one of the types of mobile bodies such as vehicle, electric vehicle, hybrid electric vehicle, motorcycle, bicycle, personal mobility, airplane, drone, ship, robot, construction machinery, and agricultural machinery (tractor).

Further, a camera module has been described as an example of the sensor module 100 in the embodiments described above. However, the present technology is not limited thereto. For example, the present technology can also be adopted for a sensor module that includes, as a sensor element, a ranging sensor such as light detection and ranging (LiDAR) or a time-of-flight (ToF) sensor.

Note that the present technology may also take the following configurations.

(1) A sensor module, including:
   a housing;
   a sensor board that includes a sensor element and is arranged in the housing;
   an external connector that is provided to the housing;
   a flexible printed circuit that electrically connects the sensor board and the external connector, the flexible printed circuit including a signal line and a ground line; and
   a metallic shield case that includes a bottom portion and a peripheral surface portion, the bottom portion being arranged between the flexible printed circuit and the external connector, the peripheral surface portion covering around the sensor board,
   the external connector including a first connection pin that is connected to the signal line, a second connection pin that is connected to the ground line, and a third connection pin that is connected to the bottom portion of the shield case,
   the bottom portion including a first hole, a second hole, a third hole, and a thermal storage, the first hole being a hole through which the first connection pin passes, the second hole being a hole through which the second connection pin passes, the third hole being a hole through which the third connection pin passes, the thermal storage being provided around the third hole and covered with a solder material used to join the third connection pin to the bottom portion.

(2) The sensor module according to (1), in which
   the flexible printed circuit further includes a base-material end that supports the signal line and the ground line and is arranged in the bottom portion,
   the base-material end includes an opening through which the third connection pin passes, the opening having a larger opening area than the third hole, and
   the thermal storage is provided to a region that faces the opening.

(3) The sensor module according to (2), in which
   the thermal storage includes a plurality of slits annularly formed around the third hole.

(4) The sensor module according to (2), in which
   the thermal storage includes a concave portion that is annularly formed around the third hole.

(5) The sensor module according to (2), in which
   the thermal storage includes a heat transfer portion that is more highly thermally conductive than a metallic material of the bottom portion.

(6) The sensor module according to any one of (2) to (5), in which
   the third connection pin is arranged offset from a center of the opening.

(7) The sensor module according to any one of (2) to (6), in which
   the opening is formed into a circular shape or an elliptic shape.

(8) The sensor module according to any one of (1) to (7), in which
   the third connection pin includes a plurality of connection pins, and
   the opening includes a plurality of openings respectively provided correspondingly to connection pins of the plurality of connection pins.

(9) The sensor module according to (8), in which
the connection pins of the plurality of connection pins are provided symmetrically with respect to the first connection pin.
(10) The sensor module according to any one of (1) to (9), in which
the sensor element is a solid-state imaging device.
(11) The sensor module according to any one of (1) to (10), in which
the sensor module is attachable to a vehicle.

REFERENCE SIGNS LIST 10 housing
11 front case
12 rear case
20 sensor board
24 solid-state imaging device (sensor element)
30 external connector
31 signal terminal
32 ground terminal
40 flexible printed circuit
41, 42 base-material end
50 shield case
51 bottom portion
52 peripheral surface portion
100 sensor module
301 first connection pin
302 second connection pin
303 third connection pin
310 thermal storage
311 slit
312 concave portion
313 heat transfer layer
401 signal line
402 ground line
501 first hole
502 second hole
503 third hole

The invention claimed is:

1. A sensor module, comprising:
a housing;
a sensor board that includes a sensor element and is arranged in the housing;
an external connector that is provided to the housing;
a flexible printed circuit that electrically connects the sensor board and the external connector, the flexible printed circuit including a signal line and a ground line; and
a metallic shield case that includes a bottom portion and a peripheral surface portion, the bottom portion being arranged between the flexible printed circuit and the external connector, the peripheral surface portion covering around the sensor board,
the external connector including a first connection pin that is connected to the signal line, a second connection pin that is connected to the ground line, and a third connection pin that is connected to the bottom portion of the shield case,
the bottom portion including a first hole, a second hole, a third hole, and a thermal storage, the first hole being a hole through which the first connection pin passes, the second hole being a hole through which the second connection pin passes, the third hole being a hole through which the third connection pin passes, the thermal storage being provided around the third hole and covered with a solder material used to join the third connection pin to the bottom portion.

2. The sensor module according to claim 1, wherein
the flexible printed circuit further includes a base-material end that supports the signal line and the ground line and is arranged in the bottom portion,
the base-material end includes an opening through which the third connection pin passes, the opening having a larger opening area than the third hole, and
the thermal storage is provided to a region that faces the opening.

3. The sensor module according to claim 2, wherein
the thermal storage includes a plurality of slits annularly formed around the third hole.

4. The sensor module according to claim 2, wherein
the thermal storage includes a concave portion that is annularly formed around the third hole.

5. The sensor module according to claim 2, wherein
the thermal storage includes a heat transfer portion that is more highly thermally conductive than a metallic material of the bottom portion.

6. The sensor module according to claim 2, wherein
the third connection pin is arranged offset from a center of the opening.

7. The sensor module according to claim 2, wherein
the opening is formed into a circular shape or an elliptic shape.

8. The sensor module according to claim 1, wherein
the third connection pin includes a plurality of connection pins, and
the opening includes a plurality of openings respectively provided correspondingly to connection pins of the plurality of connection pins.

9. The sensor module according to claim 8, wherein
the connection pins of the plurality of connection pins are provided symmetrically with respect to the first connection pin.

10. The sensor module according to claim 1, wherein
the sensor element is a solid-state imaging device.

11. The sensor module according to claim 1, wherein
the sensor module is attachable to a vehicle.

* * * * *